(12) United States Patent
Lin et al.

(10) Patent No.: US 9,349,475 B2
(45) Date of Patent: May 24, 2016

(54) TIME ESTIMATING METHOD, MEMORY STORAGE DEVICE, AND MEMORY CONTROLLING CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 254 days.

(21) Appl. No.: 14/156,477

(22) Filed: Jan. 16, 2014

(65) Prior Publication Data

US 2015/0149701 A1    May 28, 2015

(30) Foreign Application Priority Data

Nov. 22, 2013  (TW) ................. 102142669

(51) Int. Cl.
| | |
|---|---|
| G06F 12/00 | (2006.01) |
| G11C 16/32 | (2006.01) |
| G11C 16/26 | (2006.01) |
| G06F 3/06 | (2006.01) |
| G06F 11/10 | (2006.01) |
| G11C 11/56 | (2006.01) |
| G11C 16/34 | (2006.01) |

(52) U.S. Cl.
CPC ............. *G11C 16/32* (2013.01); *G06F 3/0619* (2013.01); *G06F 11/1072* (2013.01); *G11C 11/5642* (2013.01); *G11C 16/26* (2013.01); *G11C 16/349* (2013.01)

(58) Field of Classification Search
CPC .... G11C 16/26; G11C 16/32; G06F 11/1048; G06F 11/1072; G06F 12/0246; G06F 11/3419; G06F 1/3225; G06F 3/0688
See application file for complete search history.

(56) References Cited

U.S. PATENT DOCUMENTS

| | | | | |
|---|---|---|---|---|
| 7,558,109 B2* | 7/2009 | Brandman | ......... | G11C 11/1072 365/185.03 |
| 7,889,563 B2* | 2/2011 | Cho | ......... | G11C 7/06 365/185.03 |
| 7,898,865 B2* | 3/2011 | Baek | ......... | G11C 11/5628 365/185.11 |
| 8,351,256 B2* | 1/2013 | Son | ......... | G06F 11/1072 365/185.03 |
| 8,397,131 B1* | 3/2013 | Sommer | ......... | G11C 11/5642 714/763 |
| 8,510,636 B2* | 8/2013 | Ruby | ......... | G06F 11/1048 365/185.09 |
| 8,582,360 B2* | 11/2013 | Park | ......... | G11C 11/5642 365/185.09 |

(Continued)

FOREIGN PATENT DOCUMENTS

WO    2013065334    5/2013

*Primary Examiner* — John Lane
(74) *Attorney, Agent, or Firm* — Jianq Chyun IP Office

(57) ABSTRACT

A time estimating method, a memory storage device, and a memory controlling circuit unit are provided for a rewritable non-volatile memory module having memory cells. The method includes: writing first data into first memory cells of the memory cells; reading the first memory cells according to a reading voltage, so as to determine whether each of the first memory cells belongs to a first state or a second state; and calculating a quantity of the first memory cells belonging to the first state, and obtaining a time information of the rewritable non-volatile memory module according to the quantity.

21 Claims, 9 Drawing Sheets

(56) References Cited

U.S. PATENT DOCUMENTS

| | | | | |
|---|---|---|---|---|
| 2010/0232229 A1* | 9/2010 | Ogawa | | G11C 16/06 365/185.21 |
| 2012/0069666 A1* | 3/2012 | Fukuda | | G11C 11/5642 365/185.12 |
| 2012/0294104 A1* | 11/2012 | Mun | | G11C 11/56 365/218 |
| 2013/0139036 A1* | 5/2013 | Lee | | G06F 11/172 714/773 |
| 2013/0148435 A1 | 6/2013 | Matsunaga | | |
| 2013/0194883 A1* | 8/2013 | Lee | | G11C 29/04 365/201 |
| 2015/0261467 A1* | 9/2015 | Seo | | G06F 3/0619 714/758 |

* cited by examiner

TIME ESTIMATING METHOD, MEMORY STORAGE DEVICE, AND MEMORY CONTROLLING CIRCUIT UNIT

CROSS-REFERENCE TO RELATED APPLICATION

This application claims the priority benefit of Taiwan application serial no. 102142669, filed on Nov. 22, 2013. The entirety of the above-mentioned patent application is hereby incorporated by reference herein and made a part of this specification.

BACKGROUND

1. Field of the Invention

The invention relates to a time estimating method, and more particularly, to a time estimating method, a memory storage device and a memory controlling circuit unit for a rewritable non-volatile memory module.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

Generally, for data in the rewritable non-volatile memory module, if time for such data being stored in the rewritable non-volatile memory module may be calculated, uses like determining whether the data is possibly lost or determining how to read the data may then be provided. However, in case a clock or a counter is disposed for obtaining time information, an additional power supply may also be required. Accordingly, how to estimate the time information of the rewritable non-volatile memory module is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a time estimating method, a memory storage device, and a memory controlling circuit unit, and capable of estimating a time information of the rewritable non-volatile memory module.

A time estimating method is provided according to an exemplary embodiment of the invention, which is used for a rewritable non-volatile memory module. The rewritable non-volatile memory module may include a plurality of memory cells. The method includes: writing first data into first memory cells of the memory cells; reading the first memory cells according to a reading voltage, so as to determine whether each of the first memory cells belongs to a first state or a second state; and calculating a first quantity of the first memory cells belonging to the first state, and obtaining first time information of the rewritable non-volatile memory module according to the first quantity.

A memory storage device is provided according to exemplary embodiments of the invention, which includes a connection interface unit, the rewritable non-volatile memory module described above and a memory controlling circuit unit. The connection interface unit is configured to couple to a host system. The memory controlling circuit unit is coupled to the connection interface unit and the rewritable non-volatile memory module, and configured to write first data into a plurality of first memory cells of the memory cells, and read the first memory cells according to a reading voltage, so as to determine whether each of the first memory cells belongs to a first state or a second state. The memory controlling circuit unit is configured to calculate a first quantity of the first memory cells belonging to the first state, and obtain first time information of the rewritable non-volatile memory module according to the first quantity.

A memory controlling circuit unit is provided according to exemplary embodiments of the invention, and used by above-said rewritable non-volatile memory module. The memory controlling circuit unit includes a host interface, a memory interface and a memory management circuit. The host interface is configured to couple to a host system. The memory interface is configured to couple to the rewritable non-volatile memory module. The memory management circuit is coupled to the host interface and the memory interface, and configured to write first data into a plurality of first memory cells of the memory cells, and read the first memory cells according to a reading voltage, so as to determine whether each of the first memory cells belongs to a first state or a second state. The memory management circuit is also configured to calculate a first quantity of the first memory cells belonging to the first state, and obtain first time information of the rewritable non-volatile memory module according to the first quantity.

Based on above, the time estimating method, the memory storage device, and the memory controlling circuit unit provided according to the exemplary embodiments of the invention are capable of estimating the time information according to characteristics of the rewritable non-volatile memory module itself.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
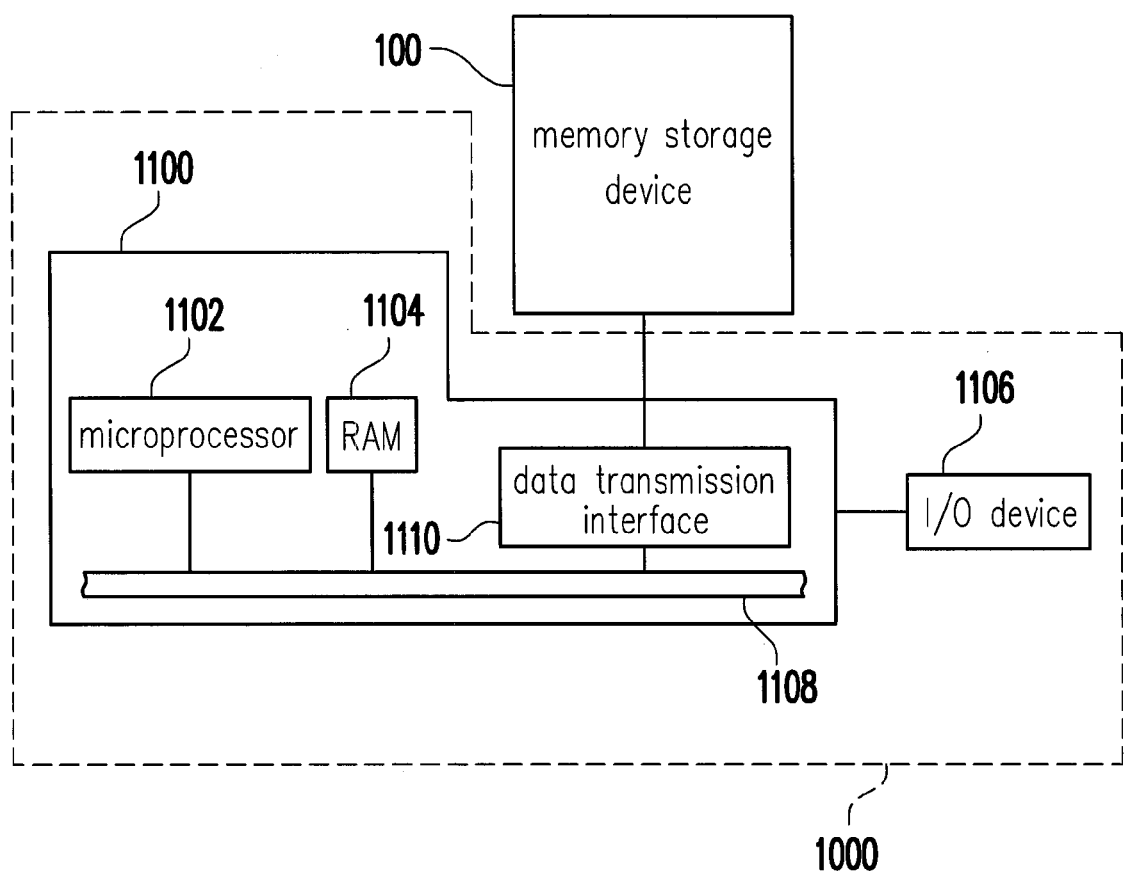
FIG. 1A illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 1B:
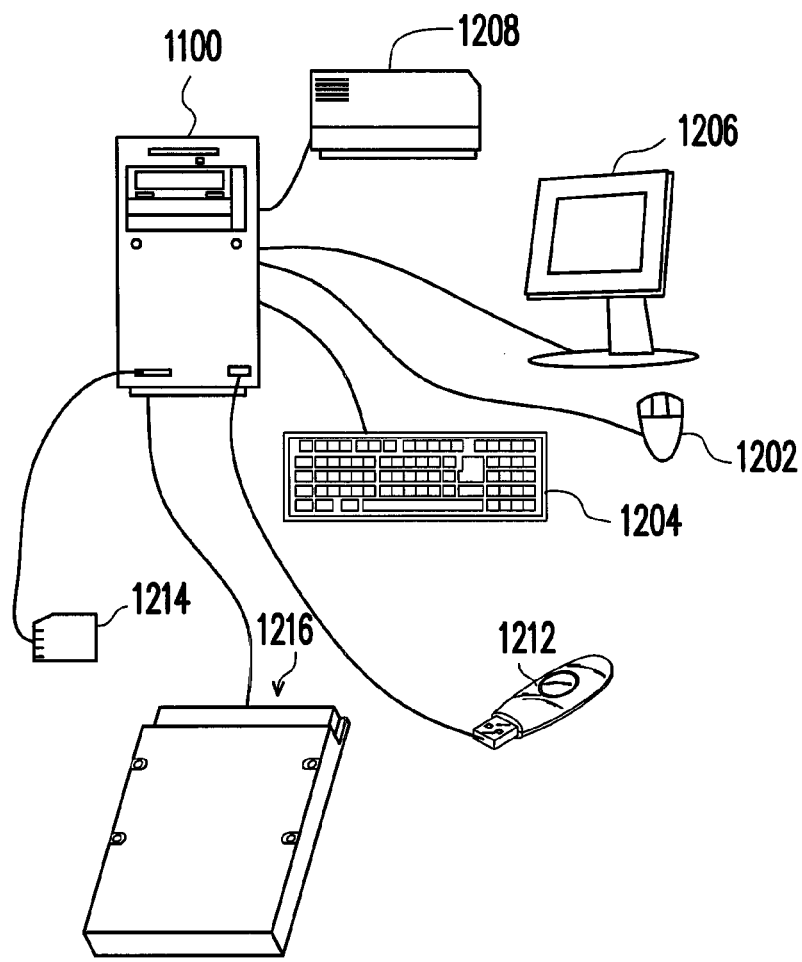
FIG. 1B is a schematic diagram illustrating a computer, an input/output device and a memory storage device according to an exemplary embodiment.
Figure 1C:
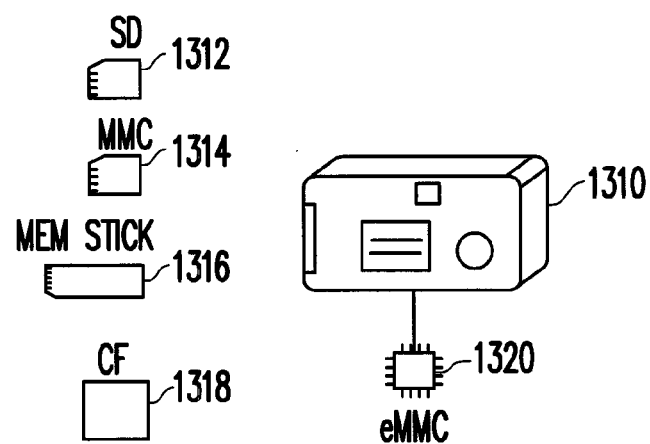
FIG. 1C is a schematic diagram illustrating a host system and a memory storage device according to an exemplary embodiment.

FIG. 1A illustrates a host system and a memory storage device according to an exemplary embodiment. FIG. 1B is a schematic diagram illustrating a computer, an input/output device and a memory storage device according to an exemplary embodiment. FIG. 1C is a schematic diagram illustrating a host system and a memory storage device according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the embodiment of the invention, the memory storage device 100 is coupled to other devices of the host system 1000 through the data transmission interface 1110. By using the microprocessor 1102, the random access memory (RAM) 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 1B.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is directly coupled to a substrate of the host system.

Figure 2:
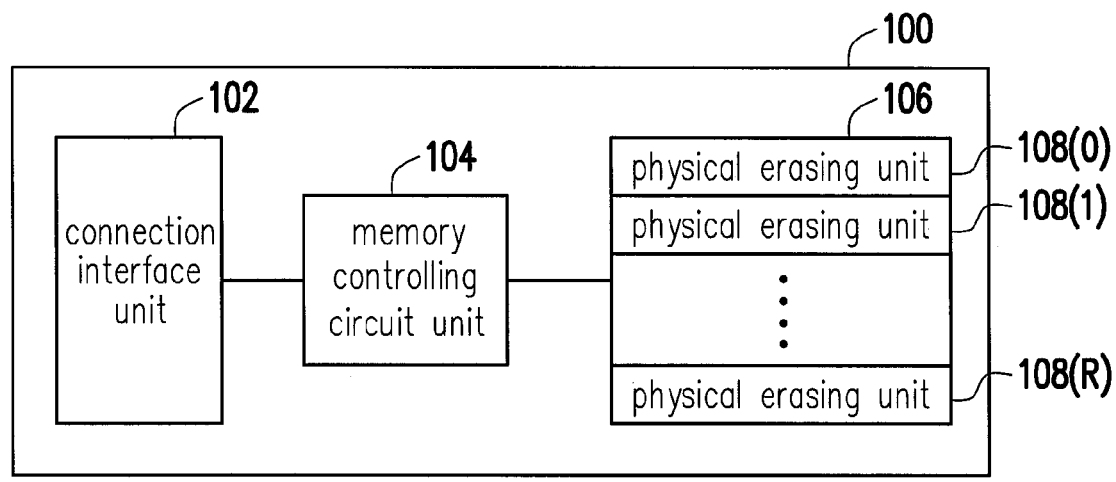
FIG. 2 is a schematic block diagram illustrating the memory storage device depicted in FIG. 1A.

FIG. 2 is a schematic block diagram illustrating the memory storage device depicted in FIG. 1A.

Referring to FIG. 2, the memory storage device 100 includes a connection interface unit 102, a memory controlling circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory stick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

Figure 3:
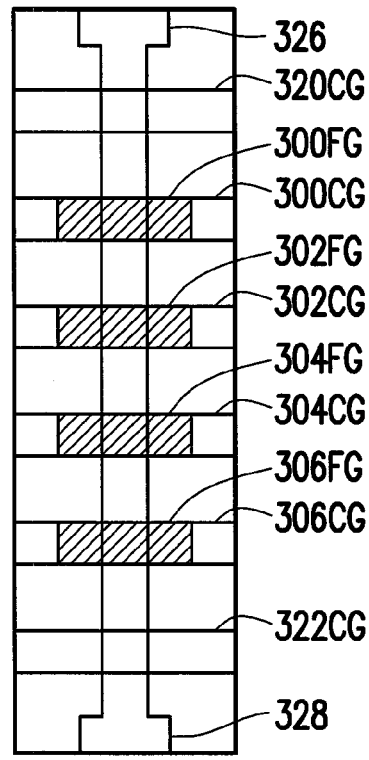
FIG. 3 illustrates a top view of a NAND string according to an exemplary embodiment.
Figure 4:
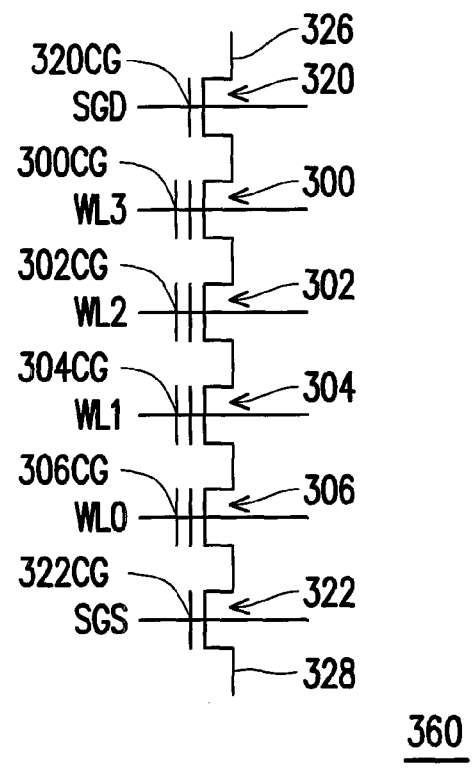
FIG. 4 illustrates an equivalent circuit diagram of a NAND string according to an exemplary embodiment.

The rewritable non-volatile memory storage module 106 is coupled to the memory controlling circuit unit 104 and configured to store data written from the host system 1000. The rewritable non-volatile memory storage module 106 has multiple physical erasing units 108(0) to 108(R). For example, the physical erasing units 108(0) to 108(R) may belong to the same memory die or belong to different memory dies. Take a NAND type flash memory as an example, in which a physical erasing unit includes a plurality of NAND strings. Each of the NAND strings may include a plurality of transistors connected in series with one other. FIG. 3 illustrates a top view of a NAND string according to an exemplary embodiment. FIG. 4 illustrates an equivalent circuit diagram of a NAND string according to an exemplary embodiment. Referring to FIG. 3 and FIG. 4, a NAND string 360 includes transistors 320, 300, 302, 304, 306 and 322. A circuit between a contact point 236 and a contact point 328 may also be referred to as a bit line. A control gate 320CG on the transistor 320 is coupled to a select line SGD; a control gate 300CG on the transistor 300 is coupled to a word line WL3; a control gate 302CG on the transistor 302 is coupled to a word line WL2; a control gate 304CG on the transistor 304 is coupled to a word line WL1; a control gate 306CG on the transistor 306 is coupled to a word line WL0; and a control gate 322CG on the transistor 322 is coupled to a select line SGS. Each of the transistors 300, 302, 304 and 306 further includes a charge-trapping layer. The charge-trapping layer is configured to store electrons or electron holes. In the present exemplary embodiment, the charge trapping layer is referred to as a floating gate, and a material thereof includes a doped poly-silicon. However, in another exemplary embodiment, the charge trapping layer may include a silicon oxide-silicon nitride-silicon oxide (ONO) composite layer, or other materials capable of storing the electrons or electron holes, and the invention is not limited thereto. In the exemplary embodiment of FIG. 3, the transistor 300 includes a floating gate 300FG; the transistor 302 includes a floating gate 302FG; the transistor 304 includes a floating gate 304FG; and the transistor 306 includes a floating gate 306FG. Herein, the transistors 300, 302, 304 and 306 may also be referred to as memory cells.

Figure 5:
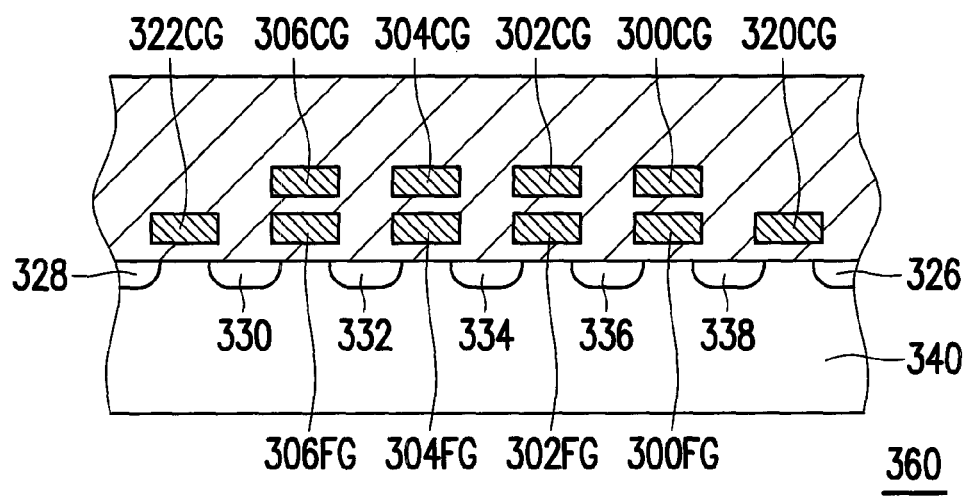
FIG. 5 illustrates a side view of a NAND string according to an exemplary embodiment.

FIG. 5 illustrates a side view of a NAND string according to an exemplary embodiment. Referring to FIG. 3 to FIG. 5, the NAND string 360 is disposed on a substrate 340. The control gates 300CG, 302CG, 304CG and 306CG are disposed on the floating gates 300FG, 302FG, 304FG and 306FG, respectively. A dielectric layer is disposed between the control gates 300CG, 302CG, 304CG, 306CG and the floating gates 300FG, 302FG, 304FG, 306FG. An oxidation layer is disposed between the floating gates 300FG, 302FG, 304FG, 306FG and the substrate 340. Doped poly-silicon layers 330, 332, 334, 336 and 338 may be shared by the adjacent transistors in FIG. 5, and a source or a drain of one transistor may be formed by one of the doped poly-silicon layers. In case data is written (i.e., programmed) into the transistors 300, 302, 304 and 306, a suitable voltage may be applied to the control gates 320CG and 322CG, so that the transistors 320 and 322 may be turned on; and a current is generated between the contact point 326 and the contact point 328. A writing voltage will be applied to the control gate on the transistor to be programmed. Herein, take the control gate 320CG as an example, in which the electrons or electron holes will be moved to the floating gate 302FG. When the electrons or electron holes are injected into the floating gate 302FG, a threshold voltage of the transistor 302 is changed for equivalently storing one or more bits. It should be note that, in other exemplary embodiments, the NAND string 360 may also include more of the memory cells, and the number of the memory cells in one NAND string is not particularly limited in the invention. Moreover, FIG. 3 to FIG. 5 are merely an example, and a coupling relation between structures or circuits of the memory cells in the rewritable non-volatile memory module 106 is not particularly limited in the invention. For instance, in an exemplary embodiment, a plurality of memory cells are stacked over one another thereby forming a flash memory in three dimension.

Figure 6:
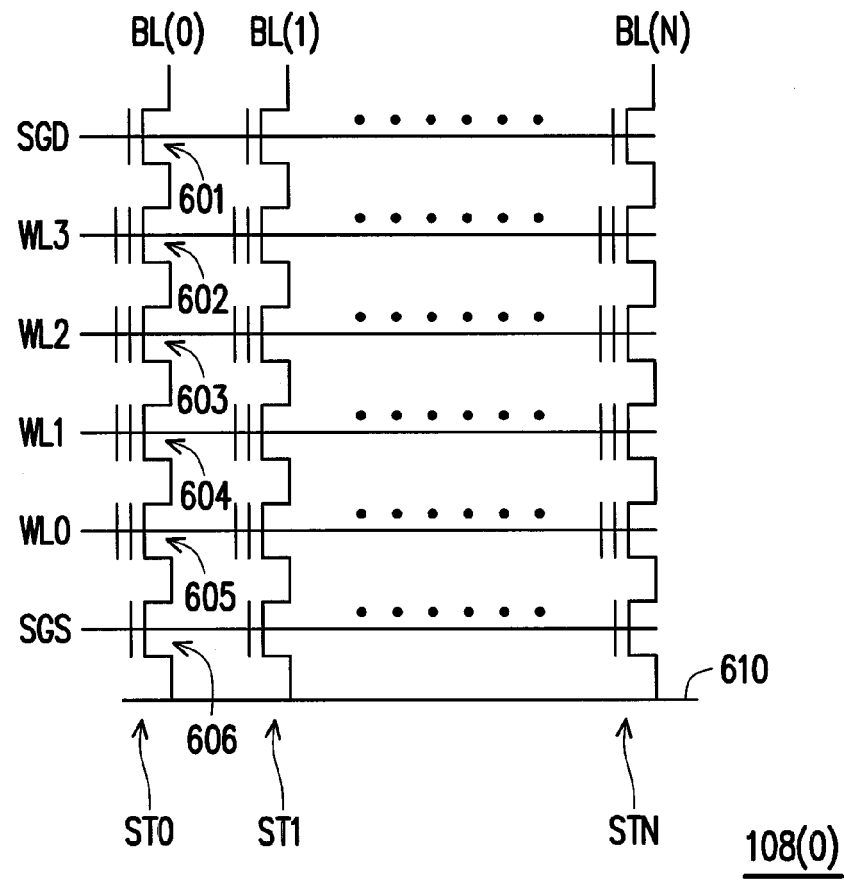
FIG. 6 illustrates a physical erasing unit according to an exemplary embodiment.

FIG. 6 illustrates a physical erasing unit according to an exemplary embodiment.

Referring to FIG. 6, take a physical erasing unit 108(0) as an example, the physical erasing unit 108(0) includes a plurality of NAND strings ST0 to STN. The NAND string ST0 includes transistors 601, 606 and memory cells 602 to 605. The NAND strings ST0 to STN are similar to the NAND string 360 depicted in FIG. 4, thus related description is omitted hereinafter. The physical erasing unit 108(0) also includes a plurality of word lines WL0 to WL3 and a plurality of bit lines BL(0) to BL(N). Each of the memory cells in the physical erasing unit 108(0) is disposed on one word line and one bit line. The memory cells on the same word line may form one or more physical programming units. More specifically, in case each of the memory cells is capable of storing x bits, at least x physical programming units may be formed by the memory cells on the same word line, in which x is a positive integer. In case the positive integer is greater than 1, the x physical programming units on the same word line may also be classified into a lower physical programming unit and an upper physical programming unit. However, a value of the positive integer x is not particularly limited in the invention. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundant bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention.

On the other hand, the NAND strings ST0 to STN are all coupled to a source line 610. When the physical erasing unit 108(0) is to be erased, an erasing voltage may be applied to a basis of the physical erasing unit 108(0), so that the electrons or electron holes in all of the floating gates in the physical erasing unit 108(0) may leave the floating gates. In the present exemplary embodiment, the physical erasing unit is a minimum unit for erasing. Namely, each physical erasing unit contains the least number of memory cells to be erased together. For instance, the physical erasing unit is a physical block.

In the present exemplary embodiment, the rewritable non-volatile memory module 106 is a Single Level Cell (SLC) NAND flash memory module in which one memory cell is capable of storing one bit. However, the invention is not limited thereto. The rewritable non-volatile memory module 106 may also be a Multi Level Cell (MLC) NAND flash memory module, a Triple Level Cell (TLC) NAND flash memory module, other flash memory modules or any memory module having the same features.

Figure 7:
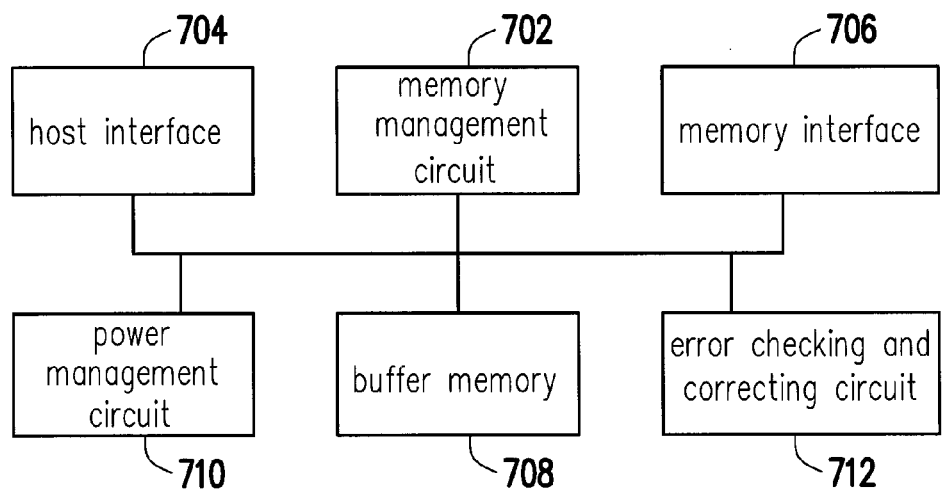
FIG. 7 is a schematic block diagram illustrating a memory controlling circuit unit according to an exemplary embodiment.

FIG. 7 is a schematic block diagram illustrating a memory controlling circuit unit according to an exemplary embodiment.

Referring to FIG. 7, the memory controller 104 includes a memory management circuit 702, a host interface 704 and a memory interface 706.

The memory management circuit 702 is configured to control the overall operations of the memory controller 104. Specifically, the memory management circuit 702 has a plurality of control commands. When the memory storage device 100 operates, the control commands are executed to perform various operations such as data writing, data reading and data erasing.

The host interface 704 is coupled to the memory management circuit 702 and configured to receive and identify commands and data sent from the host system 1000. Namely, the commands and data sent from the host system 1000 are passed to the memory management circuit 702 through the host interface 704. In the present exemplary embodiment, the host interface 704 is compatible to a SATA standard. However, it should be understood that the present invention is not limited thereto, and the host interface 704 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 706 is coupled to the memory management circuit 702 and configured to access the rewritable non-volatile memory module 106. That is, data to be written to the rewritable non-volatile memory module 106 is converted to a format acceptable to the rewritable non-volatile memory module 106 through the memory interface 706.

In an exemplary embodiment of the invention, the memory controller 104 further includes a buffer memory 708, a power management circuit 710 and an error checking and correcting circuit 712.

The buffer memory 708 is coupled to the memory management circuit 702 and configured to temporarily store data and commands from the host system 1000 or data from the rewritable non-volatile memory module 106.

The power management unit 710 is coupled to the memory management circuit 702 and configured to control a power of the memory storage device 100.

The error checking and correcting circuit 712 is coupled to the memory management circuit 702 and configured to perform an error checking and correcting process to ensure the correctness of data. Specifically, when the memory management circuit 702 receives a write command from the host system 1000, the error checking and correcting circuit 712 generates an error correcting code (ECC) for data corresponding to the write command, and the memory management circuit 702 writes data and the ECC corresponding to the write command to the rewritable non-volatile memory module 106. Subsequently, when the memory management circuit 702 reads the data from the rewritable non-volatile memory module 106, the ECC corresponding to the data is also read, and the error checking and correcting circuit 712 may execute the error checking and correcting procedure for the read data according to the ECC.

Figure 8:
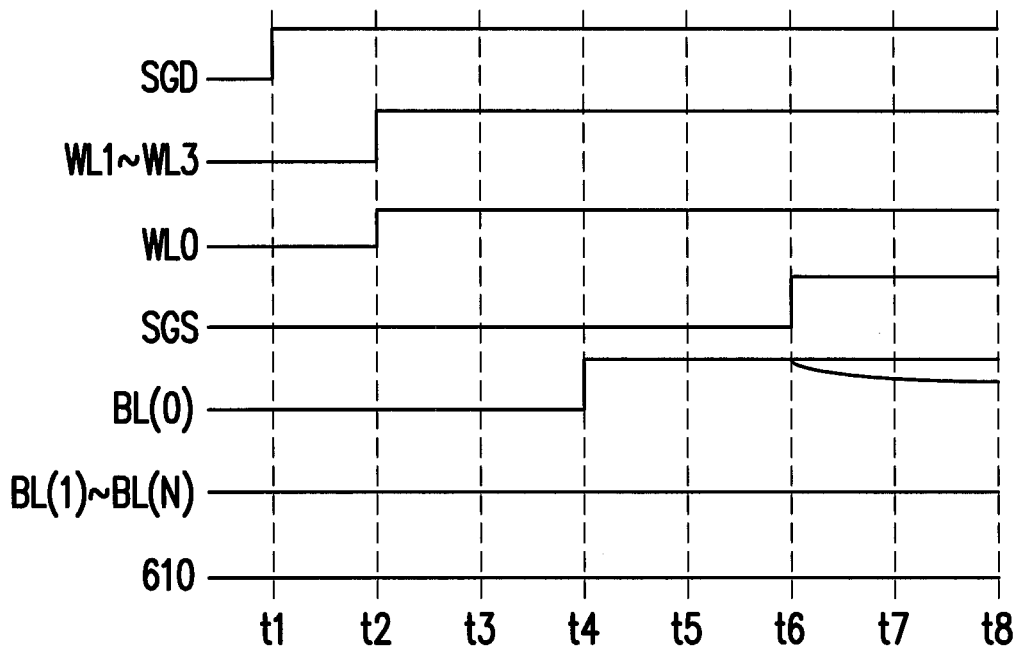
FIG. 8 illustrates a voltage timing diagram when reading a memory cell according to an exemplary embodiment.

FIG. 8 illustrates a voltage timing diagram when reading a memory cell according to an exemplary embodiment.

Referring to FIG. 6 and FIG. 8, it is assumed that the memory management circuit 702 transmitted a signal to the rewritable non-volatile memory module 106 for reading data in the memory cell 605. The rewritable non-volatile memory module 106 may correspondingly change voltage levels on the select lines SGD, SGS, the word lines WL0 to WL3, and the bit lines BL(0) to BL(N), thereby detecting states of the memory cell 605. More specifically, at an initial phase, all voltages in FIG. 8 are at low level. At a time point t1, the voltage level on the select line SGD is raised to turn on the transistor 601. At a time point t2, the voltage levels on the word lines WL1 to WL3 are raised to turn on the memory cells 602 to 604, and a reading voltage may be applied to the word line WL0. At a time point t4, the voltage level on the bit line BL(0) is raised to a pre-charge level. At a time point t6, the voltage level on the select line SGS is raised to turn on the transistor 606. A sensing current is generated on the bit line BL(0) in response to the reading voltage on the memory cell 605. Based on an magnitude of the sensing current, the voltage level on the bit line BL(0) may be dropped. More specifically, if the reading voltage on the word line WL0 is greater than a threshold voltage of the memory cell 605, the memory cell 605 may be turned on and the sensing current on the bit line BL(0) may drop the voltage level on the bit line BL(0). If the reading voltage on the word line WL0 is not greater than the threshold voltage of the memory cell 605, the memory cell 605 may be cut off and the sensing current on the bit line BL(0) will not change. Generally, the bit line BL(0) may be coupled to an amplifier for detecting the voltage level on the bit line BL(0). It should be noted that FIG. 8 is merely an example, and time and an order for raising the voltage levels on the select lines SGD, SGS, the word lines WL0 to WL3, and the bit lines BL(0) to BL(N) are not particularly limited in the invention.

Figure 9:
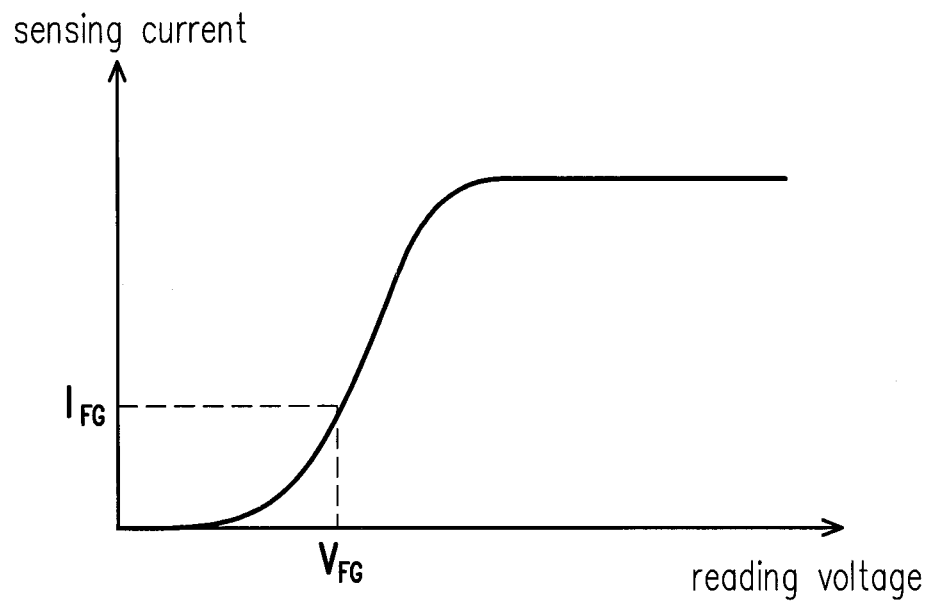
FIG. 9 is a curve diagram illustrating a relation between the reading voltage and the sensing current according to an exemplary embodiment.

In the exemplary embodiment of FIG. 8, the voltage level on the bit line BL(0) may be used to determine whether the memory cell 605 is turned on or cut off, so that the rewritable non-volatile memory module 106 may generate a verification bit correspondingly. For instance the verification bit "1" indicates cut off, and the verification bit "0" indicates turned on. However, it should be noted that, with increases of the reading voltage, practically the memory cell 605 may not be suddenly changed from "cut off" to "turned on". Therefore, in another exemplary embodiment, states of cut off or turned on are not necessarily indicated by the verification bit. FIG. 9 is a curve diagram illustrating a relation between the reading voltage and the sensing current according to an exemplary embodiment. As shown in FIG. 9, with increases of the reading voltage, the sensing current is gradually increased. Therefore, in an exemplary embodiment, the rewritable non-volatile memory module 106 may set the verification bit to "1" when the sensing current is greater than a first threshold value, and set the verification bit to "0" when the sensing current is less than a second threshold value. The first threshold value and the second threshold value may be identical or different, and the invention is not limited thereto. Or, as shown in FIG. 8, the rewritable non-volatile memory module 106 may set the verification bit to "1" only when the voltage level on the bit line BL(0) is dropped to be lower than a threshold value. From another prospective, the verification bit may be used to indicate whether the threshold voltage of the memory cell 605 is greater than the reading voltage being applied. For instance, in FIG. 9, if the sensing current is greater than a current value $I_{FG}$, it indicates that the reading voltage is greater than a threshold voltage $V_{FG}$ and the verification bit is "1". However, since the sensing current is increased gradually, values of the threshold voltage $V_{FG}$ may vary based on different determining methods. The determining methods of the threshold voltage in the memory cell are not particularly limited in the inventions. In the present exemplary embodiment, the verification bit may be decided according to intensity, variation or any other electrical properties of the sensing current, or may be decided based on the voltage level on the bit line, but the invention is not limited to the deciding methods above.

The rewritable non-volatile memory module 106 transmits the verification bit to the memory management circuit 702.

The memory management circuit 702 determines whether the memory cell 605 belongs to a first state or a second state according to the verification bit. In order to facilitate the illustration of the embodiment, the first state and the second state of the memory cell respectively indicate whether the reading voltage being applied is greater than the threshold voltage of the memory cell, or not. However, it should be noted that, since different deciding methods may be adopted, the first state and the second state may also indicate different meanings, and the meanings of the first state and the second state are not limited by the invention. In other words, whether a memory cell belongs to the first state or the second state is determined according to the sensing current or the voltage level on the bit line. Further, in other exemplary embodiments, the rewritable non-volatile memory module 106 may also transmit other signals, symbols or numbers to the memory management circuit 702 as a replacement of the above-said verification bit, and the invention is not limited thereto.

Figure 10A:
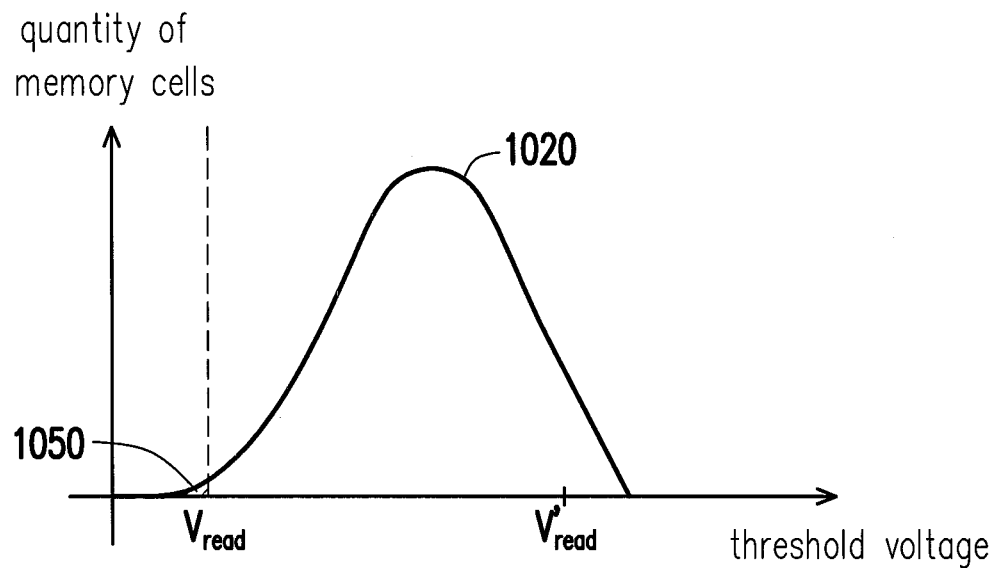
FIG. 10A to FIG. 10C are threshold voltage distribution diagrams of the first memory cells according to an exemplary embodiment.
Figure 10B:
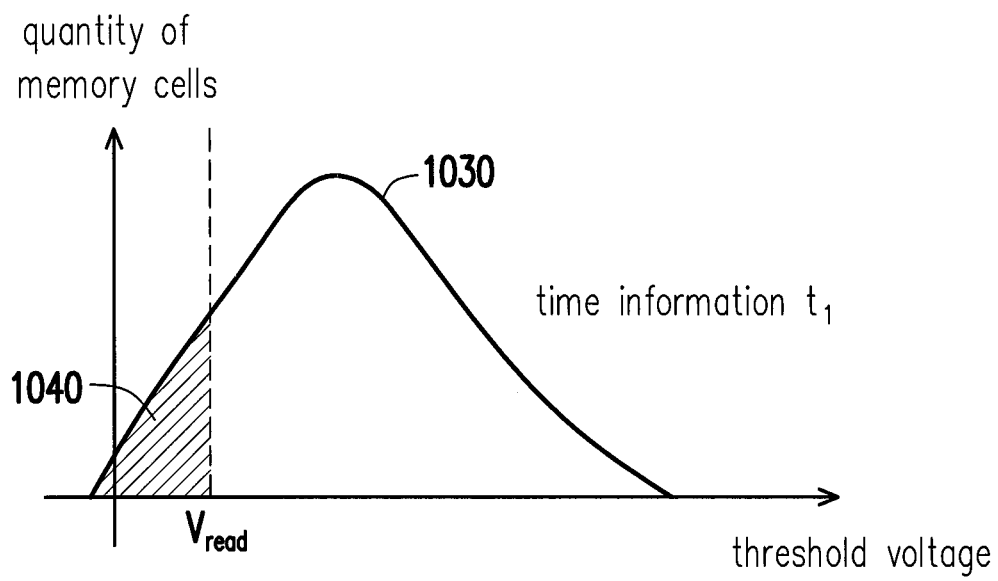
Figure 10C:
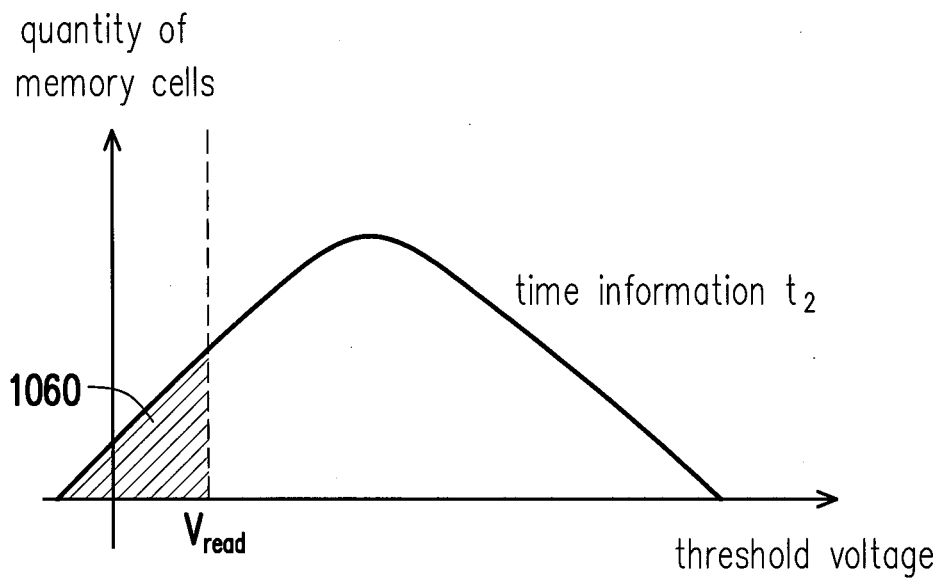

FIG. 10A to FIG. 10C are threshold voltage distribution diagrams of the first memory cells according to an exemplary embodiment.

Referring to FIG. 10A, the memory management circuit 702 writes first data into a plurality of first memory cells. FIG. 10A is a threshold voltage distribution diagram when the first data is written into the first memory cells, in which a horizontal axis represents the threshold voltage, and a vertical axis represents a quantity of the memory cells. The first memory cells may belong to the same physical erasing unit or different physical erasing units, and the invention is not limited thereto. The quantity of the first memory cells is not limited by the invention either. In an exemplary embodiment, all bits in the first data are identical. However, in another exemplary embodiment, the first data may also be generated by using a random number generation or any other methods, and the content of the first data is not limited by the invention. Moreover, the first data may be written while formatting the memory storage device 100, or written at any time points, and the invention is not limited thereto.

When the first data is written, a threshold voltage distribution of the first memory cells is as shown by a curve 1020. However, when time passes by, although the first data is still stored in the first memory cells, the threshold voltage of the first memory cells may be dropped. A relation between the threshold voltage and the time may be represented by an equation (1) below.

$$V_{FG}(t)=\beta t_{ox}/\ln\{(A\beta \cdot t/t_{ox}C_T)+\exp(\beta t_{ox}/V_{FG}(t=0))\} \quad (1)$$

A and $\beta$ is a constant. t represents time. $t_{ox}$ represent a thickness of the oxidation layer in the memory cell. $V_{FG}(t=0)$ represents the threshold voltage when the time is 0. $V_{FG}(t)$ represents the threshold voltage when the time is t. $C_T$ represents a capacitance of the oxidation layer in the memory cell. In view of the equation (1), it can be known that, with increases of the time t, the threshold voltage $V_{FG}(t)$ may be reduced. For instance, as shown in FIG. 10B, after a period of time, the distribution of the threshold voltage of the first memory cells is as shown by a curve 1030. Generally, in comparison with the curve 1020, the curve 1030 may shift to the left or become flatter.

In the present embodiment, in case the memory management circuit 702 intends to obtain the time t in the equation (1), the memory management circuit 702 reads the first memory cells according to the $V_{read}$, so as to determine whether each of the first memory cells belongs to the first state or the second state. The memory management circuit 702 calculates a quantity of the first memory cells (also known as a first quantity) belonging to the first state, and obtains time information of the rewritable non-volatile memory module 106 (also known as first time information) according to the first quantity. In the present exemplary embodiment, if the first memory cell belongs to the first state, it indicates that the threshold voltage of the first memory cell is less than or equal to the reading voltage $V_{read}$. If the first memory cell belongs to the second state, it indicates that the threshold voltage of the first memory cell is greater than the reading voltage $V_{read}$. Therefore, the first quantity represents the quantity of the first memory cells in a region 1040. The first time information (hereinafter, marked as a time information $t_1$) is configured to estimate an elapsed time from writing the first data (e.g., the timing point of FIG. 10A) to reading the first memory cell with the reading voltage $V_{read}$ (e.g., the time point of FIG. 10B). Accordingly, when the first quantity gets greater, the time estimated from the first time information $t_1$ may be greater. For instance, the memory management circuit 702 may calculate the time t according to the curve 1020, the first quantity and the equation (1). The memory management circuit 702 may obtain the curve 1020 by scanning the first memory cells through a plurality of reading voltages, or obtain the curve 1020 according to assumptions or models being pre-established, but the invention is not limited thereto. In another exemplary embodiment, a relation between the first quantity and the first time information $t_1$ may be calculated and stored in a lookup table in advance. The memory management circuit 702 may input the first quantity to the lookup table, and obtain an output of the lookup table as the time information $t_1$. For example, when the lookup table is established, a maximum value of the time t may be set to ten years, and the ten years may be quantified in eight bits. Namely, the time information recorded in the lookup table is represented by the eight bits. Accordingly, said time t may be estimated by multiplying the time information outputted from the lookup table by one specific constant. However, the number of bits used for representing the time information and the method for estimating the time t are not limited in the invention.

In another exemplary embodiment, when the first data is written into the first memory cells (e.g., the time point of FIG. 10A), the memory management circuit 702 also reads the first memory cells according to the reading voltage $V_{read}$, and determines whether each of the first memory cells belongs to the first state or the second state. The memory management circuit 702 records a quantity (also known as a second quantity) of the first memory cells belonging to the first state. For example, the second quantity represents the quantity of the first memory cells in a region 1050. The memory management circuit 702 may obtain the time information $t_1$ according to a difference between the second quantity and the first quantity. The time information $t_1$ is used to estimate an elapsed time from FIG. 10A to FIG. 10B. In case the difference between the first quantity and the second quantity gets greater, the time estimated may be greater. Similarly, the memory management circuit 702 may also input the difference between the first quantity and the second quantity to a lookup table, and obtain an output of the lookup table as the time information $t_1$. In other words, the memory management circuit 702 may obtain the time information $t_1$ according to the first quantity only, or obtain the time information $t_1$ according to difference between the first quantity and the second quantity, and the invention is not limited thereto.

As described above, the meanings of the first state and the second state are not limited by the invention. In the foregoing exemplary embodiment, if the first memory cell belongs to the first state, it indicates that the threshold voltage of the first memory cell is less than or equal to the reading voltage $V_{read}$; and if the first memory cell belongs to the second state, it indicates that the threshold voltage of the first memory cell is greater than the reading voltage $V_{read}$. However, in another exemplary embodiment, if the first memory cell belongs to the first state, it indicates that the threshold voltage of the first memory cell is greater than the reading voltage $V_{read}$; and if the first memory cell belongs to the second state, it indicates that the threshold voltage of the first memory cell is less than or equal to the reading voltage $V_{read}$. Similarly, the memory management circuit 702 may calculate a quantity of the first memory cells belonging to the first state (also known as the first quantity). In this case, when the first quantity gets smaller, the time estimated from the first time information $t_1$ may be greater. On the other hand, in the exemplary embodiment of FIG. 10A to FIG. 10B, the reading voltage $V_{read}$ is located at a left side of the curves 1020 and 1030. However, the reading voltage (e.g., a reading voltage $V'_{read}$) may also be located at a right side of the curves 1020 and 1030.

In an exemplary embodiment, for the data written into the rewritable non-volatile memory module 106, the memory management circuit 702 records the time information thereof correspondingly. More specifically, at the time point of FIG. 10B, the memory management circuit 702 writes second data into the rewritable non-volatile memory module 106, so that the memory management circuit 702 obtains the time information $t_1$ by using above said method. Accordingly, the time information $t_1$ is used to estimate an elapsed time from writing the first data (e.g., the time point of FIG. 10A) to writing the second data. In an exemplary embodiment, for each of the physical programming units being programmed, the memory management circuit 702 records the time information correspondingly. However, the memory management circuit 702 may also record the time information for each physical sector or physical erasing unit being programmed, and the invention is not limited thereto.

The time information being recorded may be used to determine how to read the second data stored in the rewritable non-volatile memory module 106. For instance, it is assumed that the threshold voltage distribution of the first memory cell is as shown in FIG. 10C after the second data has been written for a period of time. At the time, the memory management circuit 702 receives a reading command from a host system, and the reading command instructs to read logical addresses where the second data is. After the reading command is received, the memory management circuit 702 re-reads the first memory cells according to the reading voltage $V_{read}$, so as to determine whether the first memory cells belong to the first state or the second state. The memory management circuit 702 calculates a quantity (also known as a third quantity) of the first memory cells belonging to the first state, and obtain second time information (hereinafter, marked as a time information $t_2$) according to the third quantity. For example, the third quantity is a quantity of the first memory cells in a region 1060, and the time information $t_2$ is used to estimate an elapsed time from writing the first data (e.g., the time point of FIG. 10A) to re-reading the first memory cells (e.g., a time point of FIG. 10C). The memory management circuit 702 may obtain third time information according to the time information $t_2$ and the time information $t_1$. For instance, the memory management circuit 702 subtracts the time information $t_2$ by the time information $t_1$ for obtaining the third time information. Accordingly, the third time information is used to estimate an elapsed time from writing the second data to reading the second data (i.e., an elapsed time of the second data stored in the rewritable non-volatile memory module 106). If the elapsed time of the second data stored in the rewritable non-volatile memory module 106 gets longer, a chance for errors to occur on the second data may become higher. Therefore, the memory management circuit 702 may read the second data in the rewritable non-volatile memory module 106 according to the third time information. For example, an encode procedure for the error correcting code is performed when writing the second data. The memory management circuit 702 may obtain at least one first voltage according to the third time information, and read the second data according to the first voltage. If the time estimated from the third time information gets longer (i.e., a possibility for errors to occur on the second data may be higher or more erroneous bits may be included), more information is required in order to improve a capability for error correcting. Accordingly, in an exemplary embodiment, when the time estimated from the third time information gets higher, the quantity of the first voltages required may be greater, so as to obtain more of the verification bits (also known as soft bit information). The verification bits may be used to execute an error correcting code such as a low density parity code (LDPC). Generally, when the quantity of the first voltage is higher, a correcting capability of the low density parity code may be better. In case it is the low density parity code being used, in another exemplary embodiment, the third time information may also be used to decide whether to decode by using a hard bit mode or a soft bit mode.

In the foregoing exemplary embodiment, the elapsed time of the second data stored in the rewritable non-volatile memory module 106 is speculated according to the states of the first memory cells. However, in another exemplary embodiment, the time may be estimated according to the states of the memory cells storing the second data. For instance, at the time point of FIG. 10B, the second data is written into a plurality of second memory cells, and the memory management circuit 702 may read the second memory cells according to a reading voltage and read a quantity of the second memory cells belonging to the first state. At the time point of FIG. 10C, the memory management circuit 702 may read the second memory cells again according to the reading voltage, and obtain a quantity of the second memory cells belonging to the first state at the time. According to said two quantities, the memory management circuit 702 may obtain the elapsed time from writing the second data to reading the second data.

It should be noted that, in some cases, errors may occur on the time t calculated according to said equation (1). For instance, in case the rewritable non-volatile memory module 106 is at a relatively high temperature environment, the time t calculated may be relatively greater. However, in the present exemplary embodiment, since the first data and the second data are stored in the same rewritable non-volatile memory module 106, the time information obtained by using above methods may be used to accurately determine the possibility for the errors to occur on the second data.

In the exemplary embodiment depicted in FIG. 10A to FIG. 10C, the memory management circuit 702 uses the same reading voltage $V_{read}$ to read the first memory cells for obtaining the corresponding time information. However, in another exemplary embodiment, the memory management circuit 702 may use different reading voltages at different time points to read the first memory cells. For instance, after the first memory cells are read by using different reading voltages, the memory management circuit 702 may obtain the time information according to the reading voltages, the equation (1) and the curve 1020 being used, but the invention is not limited thereto.

Figure 11:
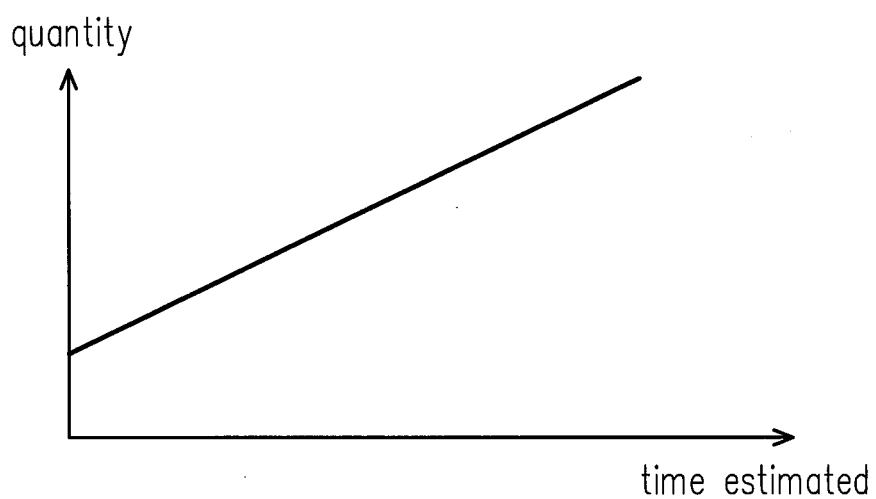
FIG. 11 is a curve diagram illustrating a relation between the quantity of the first memory cells belonging to the first state and the time estimated from the time information according to an exemplary embodiment.

FIG. 11 is a curve diagram illustrating a relation between the quantity of the first memory cells belonging to the first state and the time estimated from the time information according to an exemplary embodiment.

Referring to FIG. 10A and FIG. 11, in an exemplary embodiment, the memory management circuit 702 sets the reading voltage $V_{read}$ to be located at a fringe area of the curve 1020, such that the quantity of the first memory cells belonging to the first state and the time estimated from the time information may be substantially proportional (as shown in FIG. 11) with elapse of time. More specifically, the memory management circuit 702 may obtain a composition function according to the function (1) and a function represented by the curve 1020 in FIG. 10A. The memory management circuit 702 may obtain integrals of the threshold voltage, then obtain quadratic differentials of the time on the composition function, and then obtain the reading voltage $V_{read}$ by obtaining a minimum value among differentiated results thereof. For instance, the memory management circuit 702 may calculate the reading voltage $V_{read}$ according to following equations (2) and (3). Therein, $DF(V_{th})$ is the function represented by the curve 1020, and $\gamma$ is a constant.

$$\min_{V_{read}} \left( \frac{d^2 \left( \int_{-\infty}^{V_{read}} DF(Vth + \Delta Vth(t)) \, dVth \right)}{dt^2} \right) \quad (2)$$

$$\Delta Vth(t) = \frac{V_{FG}(t) - V_{FG}(0)}{\gamma} \quad (3)$$

Figure 12:
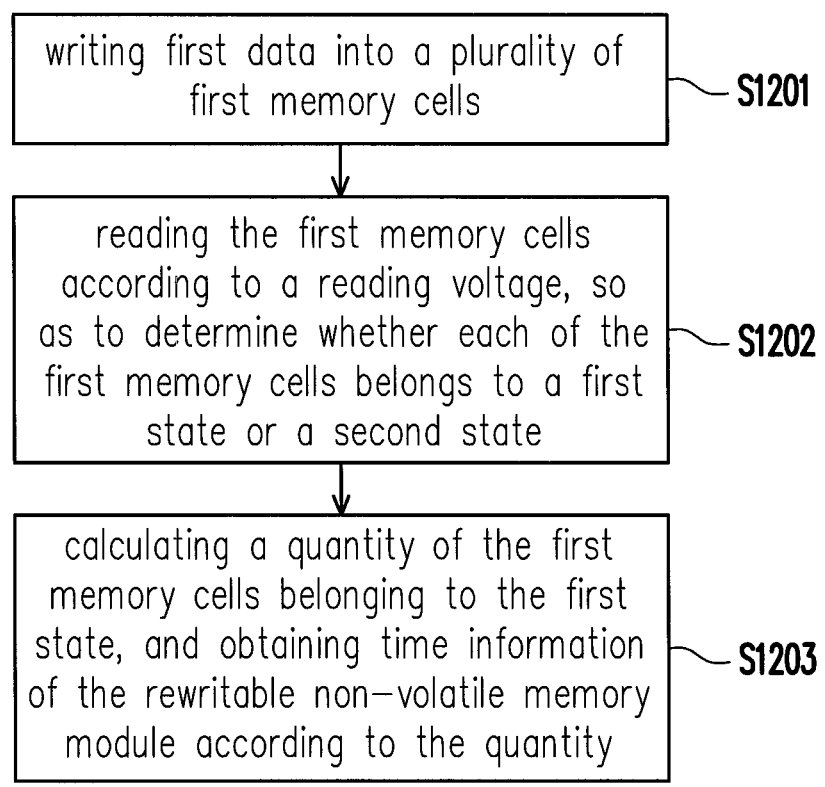
FIG. 12 is a flowchart illustrating a time estimating method according to an exemplary embodiment.

FIG. 12 is a flowchart illustrating a time estimating method according to an exemplary embodiment.

Referring to FIG. 12, in step S1201, first data is written into a plurality of first memory cells. In step S1202, the first memory cells is read according to a reading voltage, so as to determine whether each of the first memory cells belongs to a first state or a second state. In step S1203, a quantity of the first memory cells belonging to the first state is calculated, and time information of the rewritable non-volatile memory module is obtained according to the quantity. Nevertheless, steps depicted in FIG. 12 are described in detail as above, thus related description is omitted hereinafter. It should be noted that, the steps depicted in FIG. 12 may be implemented as a plurality of program codes or circuits. However, the invention is not limited thereto. Moreover, the method disclosed in FIG. 12 may be implemented with reference to above embodiments, or may be implemented independently, the invention is not limited thereto.

In view of above, the time estimating method, the memory storage device and the memory controlling circuit unit proposed by the exemplary embodiments of the invention are capable of obtaining the time information by using the quantity of the first memory cells belonging to the first state without disposing the clock and the additional power supply. In addition, since the time information is obtained according to characteristics of the rewritable non-volatile memory module itself, the time estimated may be more accurate.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A time estimating method for a rewritable non-volatile memory module, wherein the rewritable non-volatile memory module comprises a plurality of memory cells, and the time estimating method comprises:
    writing first data into a plurality of first memory cells of the memory cells;
    reading the first memory cells according to a reading voltage, so as to determine whether each of the first memory cells belongs to a first state or a second state; and
    calculating a first quantity of the first memory cells belonging to the first state, and obtaining first time information of the rewritable non-volatile memory module according to the first quantity.

2. The time estimating method of claim 1, wherein the step of writing the first data into the first memory cells further comprises:
    reading the first memory cells according to the reading voltage, so as to determine whether each of the first memory cells belongs to the first state or the second state; and
    recording a second quantity of the first memory cells belonging to the first state,
    wherein the step of obtaining the first time information according to the first quantity comprises:
        obtaining the first time information according to a difference between the first quantity and the second quantity, wherein the first time information is used to estimate an elapsed time from writing the first data to reading the first memory cells.

3. The time estimating method of claim 1, further comprising:
    writing second data into the rewritable non-volatile memory module; and
    recording the first time information, wherein the first time information is used to estimate an elapsed time from writing the first data to writing the second data.

4. The time estimating method of claim 3, further comprising:
    receiving a reading command from a host system, wherein the reading command instructs to read the second data;
    re-reading the first memory cells according to the reading voltage, so as to determine whether the first memory cells belong to the first state or the second state, calculating a third quantity of the first memory cells belonging to the first state, and obtaining second time information of the rewritable non-volatile memory module according to the third quantity, wherein the second time information is used to estimate an elapsed time from writing the first data to re-reading the first memory cells.
    obtaining third time information according to the second time information and the first time information, wherein the third time information is used to estimate an elapsed time from writing the second data to reading the second data.

5. The time estimating method of claim 4, further comprising:
    determining a number of at least one first voltage according to the third time information, and reading the second data according to the at least one first voltage.

6. The time estimating method of claim 1, wherein each of the first memory cells is disposed on a bit line, each of the bit lines generates a sensing current in response to the reading voltage, and the time estimating method further comprises:
  determining whether each of the first memory cells belongs to the first state or the second state according to the sensing current generated by each of the bit lines or a voltage level on each of the bit lines.

7. The time estimating method of claim 1, wherein the step of obtaining the first time information according to the first quantity comprises:
  inputting the first quantity to a lookup table, and obtaining an output of the lookup table as the first time information.

8. A memory storage device, comprising:
  a connection interface unit configured to couple to a host system;
  a rewritable non-volatile memory module comprising a plurality of memory cells; and
  a memory controlling circuit unit coupled to the connection interface unit and the rewritable non-volatile memory module, and configured to write first data into a plurality of first memory cells of the memory cells, and read the first memory cells according to a reading voltage, so as to determine whether each of the first memory cells belongs to a first state or a second state,
  wherein the memory controlling circuit unit is configured to calculate a first quantity of the first memory cells belonging to the first state, and obtain first time information of the rewritable non-volatile memory module according to the first quantity.

9. The memory storage device of claim 8, wherein the operation of the memory controlling circuit unit writing the first data into the first memory cells further comprises:
  the memory controlling circuit unit reads the first memory cells according to the reading voltage, so as to determine whether each of the first memory cells belongs to the first state or the second state, and records a second quantity of the first memory cells belonging to the first state,
  wherein the operation of the memory controlling circuit unit obtaining the first time information according to the first quantity comprises:
    the memory controlling circuit unit obtains the first time information according to a difference between the first quantity and the second quantity, wherein the first time information is used to estimate an elapsed time from writing the first data to reading the first memory cells.

10. The memory storage device of claim 8, wherein the memory controlling circuit unit is further configured to write second data into the rewritable non-volatile memory module, and record the first time information, wherein the first time information is used to estimate an elapsed time from writing the first data to writing the second data.

11. The memory storage device of claim 10, wherein the memory controlling circuit unit is further configured to receive a reading command from the host system, wherein the reading command instructs to read the second data,
  wherein the memory controlling circuit unit is further configured to re-read the first memory cells according to the reading voltage, so as to determine whether the first memory cells belong to the first state or the second state, calculate a third quantity of the first memory cells belonging to the first state, and obtain second time information of the rewritable non-volatile memory module according to the third quantity, wherein the second time information is used to estimate an elapsed time from writing the first data to re-reading the first memory cells,
  wherein the memory controlling circuit unit is further configured to obtain third time information according to the second time information and the first time information, wherein the third time information is used to estimate an elapsed time from writing the second data to reading the second data.

12. The memory storage device of claim 11, wherein the memory controlling circuit unit is further configured to determine a number of at least one first voltage according to the third time information, and read the second data according to the at least one first voltage.

13. The memory storage device of claim 8, wherein each of the first memory cells is disposed on a bit line, and each of the bit lines generates a sensing current in response to the reading voltage,
  wherein whether each of the first memory cells belongs to the first state or the second state is determined according to the sensing current generated by each of the bit lines or a voltage level on each of the bit lines.

14. The memory storage device of claim 8, wherein the operation of the memory controlling circuit unit obtaining the first time information according to the first quantity comprises:
  the memory controlling circuit unit inputs the first quantity to a lookup table, and obtains an output of the lookup table as the first time information.

15. A memory controlling circuit unit, for a rewritable non-volatile memory module, wherein the rewritable non-volatile memory module comprises a plurality of memory cells, and the memory controlling circuit unit comprises:
  a host interface configured to couple to a host system;
  a memory interface configured to couple to the rewritable non-volatile memory module; and
  a memory management circuit coupled to the host interface and the memory interface, and configured to write first data into a plurality of first memory cells of the memory cells, and read the first memory cells according to a reading voltage, so as to determine whether each of the first memory cells belongs to a first state or a second state,
  wherein the memory management circuit is configured to calculate a first quantity of the first memory cells belonging to the first state, and obtain first time information of the rewritable non-volatile memory module according to the first quantity.

16. The memory controlling circuit unit of claim 15, wherein the operation of the memory management circuit writing the first data into the first memory cells further comprises:
  the memory management circuit reads the first memory cells according to the reading voltage, so as to determine whether each of the first memory cells belongs to the first state or the second state, and records a second quantity of the first memory cells belonging to the first state,
  wherein the operation of the memory management circuit obtaining the first time information according to the first quantity comprises:
    the memory management circuit obtains the first time information according to a difference between the first quantity and the second quantity, wherein the first time information is used to estimate an elapsed time from writing the first data to reading the first memory cells.

17. The memory controlling circuit unit of claim 15, wherein the memory management circuit is further configured to write second data into the rewritable non-volatile memory module, and record the first time information, wherein the first time information is used to estimate an elapsed time from writing the first data to writing the second data.

18. The memory controlling circuit unit of claim 17, wherein the memory management circuit is further configured to receive a reading command from the host system, wherein the reading command instructs to read the second data, wherein the memory management circuit is further configured to re-read the first memory cells according to the reading voltage, so as to determine whether the first memory cells belong to the first state or the second state, calculate a third quantity of the first memory cells belonging to the first state, and obtain second time information of the rewritable non-volatile memory module according to the third quantity, wherein the second time information is used to estimate an elapsed time from writing the first data to re-reading the first memory cells, wherein the memory management circuit is further configured to obtain third time information according to the second time information and the first time information, wherein the third time information is used to estimate an elapsed time from writing the second data to reading the second data.

19. The memory controlling circuit unit of claim 18, wherein the memory management circuit is further configured to determine a number of at least one first voltage according to the third time information, and read the second data according to the at least one first voltage.

20. The memory controlling circuit unit of claim 15, wherein each of the first memory cells is disposed on a bit line, and each of the bit lines generates a sensing current in response to the reading voltage, wherein whether each of the first memory cells belongs to the first state or the second state is determined according to the sensing current generated by each of the bit lines or a voltage level on each of the bit lines.

21. The memory controlling circuit unit of claim 15, wherein the operation of the memory management circuit obtaining the first time information according to the first quantity comprises:

the memory management circuit inputs the first quantity to a lookup table, and obtains an output of the lookup table as the first time information.

* * * * *